United States Patent
Hotzel

(10) Patent No.: US 8,574,795 B2
(45) Date of Patent: Nov. 5, 2013

(54) LITHOGRAPHIC CD CORRECTION BY SECOND EXPOSURE

(75) Inventor: Arthur Hotzel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/595,650

(22) Filed: Aug. 27, 2012

(65) Prior Publication Data

US 2013/0078558 A1 Mar. 28, 2013

Related U.S. Application Data

(63) Continuation-in-part of application No. 13/241,995, filed on Sep. 23, 2011.

(51) Int. Cl.
*G03C 5/00* (2006.01)
*G03F 9/00* (2006.01)

(52) U.S. Cl.
USPC ............. 430/30; 430/5; 430/328; 430/394; 430/396

(58) Field of Classification Search
USPC .............................. 430/5, 30, 328, 394, 396
See application file for complete search history.

(56) References Cited

U.S. PATENT DOCUMENTS

| 8,304,180 B2 * | 11/2012 | Van Ingen Schenau et al. ............... 430/394 |
| 2006/0057471 A1 * | 3/2006 | Schenau et al. ............. 430/5 |

* cited by examiner

*Primary Examiner* — Christopher Young
(74) *Attorney, Agent, or Firm* — Ditthavong, Mori & Steiner, PC

(57) ABSTRACT

Correction of CD variation is accomplished with a second exposure, e.g. using a second reticle. Embodiments include exposing a first wafer with a first dose using a first reflective reticle having a pattern corresponding to a wafer target pattern, or measuring and/or inspecting first reticle pattern portions and calculating and/or simulating corresponding first wafer pattern portions obtained with a predetermined first dosage, identifying CD variations between the exposed wafer or the calculated/simulated first wafer pattern and the target pattern for different target pattern features, exposing a second wafer with the first reticle using a second dose, and correcting the CD variations by applying an additional exposure of the second wafer, before or after exposing the second wafer with the first reticle. Embodiments further include using additional exposures to prevent printing unwanted structures on the reticle or to deliberately vary sizes of selected structures on the wafer for development purposes.

22 Claims, 8 Drawing Sheets

LITHOGRAPHIC CD CORRECTION BY SECOND EXPOSURE

CROSS-REFERENCE TO RELATED APPLICATION

The present application is a continuation-in-part of U.S. application Ser. No. 13/241,995, filed on Sep. 23, 2011, the entire contents of which is herein incorporated by reference.

TECHNICAL FIELD

The present disclosure relates to corrections of critical dimension (CD) variations in lithographic processes. The present disclosure is particular applicable to semiconductor devices in 28 nanometer (nm), 20 nm, and smaller technology nodes.

BACKGROUND

A lithographic photomask, or reticle, is conventionally used for patterning wafers. Reticles may be transmissive or reflective, for example an extreme ultraviolet (EUV) reticle. Deviations of feature sizes or CDs (critical dimensions) on the wafer from their respective target values can limit the process window and the yield, thereby increasing cost, particularly, but not only, for double patterning applications, which have very small error margins for CDs. By optimizing the exposure dose, an overall best match between the printed CDs and the target CDs may be achieved. However, if the deviations differ substantially for various features within the pattern, the CD deviations of the different features may still limit process window and yield after such an overall dose optimization. Such a situation may be caused by multiple factors. For example, CD variations may occur across the reticle and then be transferred to the wafer during exposure with the reticle. Also, there may be pattern density variations in the design that influence the printed CDs on the wafer, or mistakes in the design, or there may be non-optimum data sizing in the calculation of the reticle pattern from the original design data. Particularly for designs with different structures, such as multipurpose wafers as used for 28 nanometer (nm) IP shuttles (i.e., devices containing data from different customers for testing and qualification purposes) and devices containing both memory (e.g., SRAM) and logic, it may be difficult to pattern all of the different structures with correct target CDs.

Another problem is that test structures with small sizes, which are printed on the wafer, may collapse or be lifted during the subsequent wafer processing, thereby causing defects on the wafer. In this case, it is desirable to eliminate these structures on the wafer, in other words, to reduce their CD to zero or, alternatively, to increase their CD substantially to make them more stable. Finally, in product development it can be useful to selectively vary the sizes of some specific structures on the wafer to test the impact of such variations, for example, on performance or yield.

CD variations may be corrected by replacing the reticle with a corrected one. However, ordering a new reticle is expensive and adds significant time to the setup time, as no wafers may be printed while the new reticle is being produced. Further, a new reticle must be qualified again (i.e., checked again for errors) thereby adding more time to the setup time. Alternatively, CD variations of transmissive reticles may be corrected by modifying the existing reticle. However, such reticle correction requires an expensive tool and running costs, and no wafers may be patterned while the reticle is being corrected. Further, with the currently available ways to modify the CD of an already existing reticle, the reticle may be damaged, or registration may fail, new errors may be introduced by the modification, and all changes are usually irreversible. Long range CD variations can be corrected by the exposure tool (with the so-called "dose mapper" function), but both the spatial resolution and the number of degrees of freedom of this correction method are limited.

An EUV (extreme ultra-violet) reticle is formed from an EUV blank, which includes a reflective multilayer dielectric stack (for example, fifty alternating layers) on a non-transmissive (to EUV radiation) substrate. EUV reticles are costly as well as difficult to manufacture, at least in part because there is yet no known way to make an entirely defect-free EUV reticle. In addition, due to the differences in build between EUV and conventional transmissive reticles, and the differences in exposure technique between EUV and conventional optical lithography, there is at present no known method to correct CD variations of EUV reticles by subsequent modification of an already existing reticle or by modifications of the exposure within the exposure tool ("dose mapper"). Thus, ordering a replacement reticle is currently the only option if CD variations of an EUV reticle exceed the allowed process window. However, due to the aforementioned challenges in the manufacturing of EUV reticles, this option is even more costly and time-consuming than in the case of conventional reticles.

A need therefore exists for methodology enabling correction of CD variations which are reproducible and which similarly occur in every image field on every wafer, and enabling deliberate variations of CD, without replacing or modifying the reticle.

SUMMARY

An aspect of the present disclosure is a method of correcting CD variations on a wafer by applying a second exposure.

Another aspect of the present disclosure is a method of correcting undersized contacts or other individual features on a wafer by applying a second exposure.

Another aspect of the present disclosure is a method of eliminating small test structures on a wafer, which create a defect hazard, by applying a second exposure.

Another aspect of the present disclosure is a method of varying CDs of selected structures by applying one or more additional exposures.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method comprising: obtaining a first reflective reticle having a pattern corresponding to a target pattern for a wafer; exposing a first wafer covered with a first photoresist with the first reticle using a first dosage, optimized to achieve the best overall matching between the printed wafer CD and the target CD of the critical features in the design; identifying variations in critical dimension (CD) between the exposed wafer and the target pattern for different features in the target pattern; exposing a second wafer covered with a second photoresist with the first reticle using a second dosage; and correcting the CD variations by applying an additional exposure to the second wafer, to the second photoresist that is also exposed with the first reticle, before or after exposing the second photoresist with the first reticle. As an alternative to actually exposing a first wafer, a suitable additional exposure may be determined by measurement and/or inspection of the pattern on the reticle, which may be followed by the calculation or simulation of corresponding portions of a wafer pattern, variations of which with respect to the target pattern may then be identified.

Aspects of the present disclosure include applying the additional exposure by obtaining a correction reticle having transmission or reflection variations corresponding to the identified CD variations and exposing the second wafer with the correction reticle using a third dosage. Further aspects include the correction reticle having spatial variations in average transmission or reflection that occur in a range that is longer compared to sizes of the pattern on the first reticle. Another aspect includes artificially decreasing the spatial resolution of the additional exposure with the correction reticle to achieve smooth intensity variations, for example by adjusting the numerical aperture of the optical system and/or the focus of the additional exposure and/or the illumination conditions of the correction reticle. Additional aspects include exposing the second wafer with the first reticle on a first tool, and exposing the second wafer with the correction reticle on a second tool, less advanced than the first tool. Further aspects include obtaining a correction reticle by programming a programmable reticle. Other aspects include determining the second dosage by: identifying portions of the exposed first wafer, or the calculated/simulated wafer pattern, where the sizes of the illuminated parts of the pattern are larger than the corresponding sizes of the target pattern; and calculating a dosage required to expose portions of the second wafer, corresponding to the identified portions, to substantially obtain the CD of the corresponding portions of the target pattern. Other aspects include applying the additional exposure to the second wafer using a wavelength different from a wavelength used for the exposure of the second wafer with the first reticle or using charged particles.

Further aspects include the features having CD variations being individual contact holes or other individual features; the CD variations of the individual features corresponding to a lack of illumination intensity in the formation of these features; and the additional exposure including: obtaining a correction reticle having second openings or reflective portions, or second areas with sub-resolution structures which modulate transmission or reflection, at positions corresponding to the positions of the features having identified CD variations; aligning the second openings or reflective portions, or second areas with sub-resolution structures, of the correction reticle with the features having identified CD variations on the second wafer; and exposing the second wafer with the correction reticle using a third dosage. Additional aspects include the size of the second openings or reflective portions, or of the second areas with sub-resolution structures, of the correction reticle being larger than the size of the structures in the first reticle that correspond to the features having CD variations.

Another aspect of the present disclosure is a method including: obtaining a first reflective reticle having a pattern corresponding to a target pattern for a wafer and having additional structures; exposing a wafer covered with photoresist with the first reticle using a first dosage; and applying a second exposure to the photoresist covered wafer, before or after exposing the wafer with the first reticle, illuminating only areas of the wafer corresponding to the areas containing the additional structures in the first reticle, with a second dosage sufficient either to prevent the formation of the additional structures on the wafer or to modify their size and shape to increase the stability of the formed additional structures.

Aspects include applying the second exposure by: obtaining a correction reticle having one or more openings or reflective portions at positions corresponding to positions of the additional structures on the first reticle; aligning the correction reticle with the wafer; and exposing the wafer with the correction reticle using the second dosage. Further aspects include exposing the wafer with the first reticle on a first tool, and exposing the wafer with the correction reticle on a second tool, less advanced than the first tool. Other aspects include obtaining a correction reticle including programming a programmable reticle. Additional aspects include sequentially: forming a resist on the wafer; exposing the resist-covered wafer with the first reticle, and applying the second exposure to the resist-covered wafer; and developing the resist. Another aspect includes applying the second exposure using a wavelength different from a wavelength used for the exposure of the wafer with the first reticle or using charged particles Another aspect of the present disclosure is a method including: obtaining a first reflective reticle having a pattern corresponding to a target pattern for a wafer, the target pattern containing structures of multiple structure types, each structure type corresponding to a different area; exposing one or more wafers covered with photoresist with the first reticle using a first dosage; selectively varying the sizes of structures of selected structure types in the different areas on the wafer by applying one or more additional exposures in the areas corresponding to the selected structure types, to the same photoresist that is exposed with the first reticle, the illumination intensity of the additional exposures being substantially uniform within each area containing a selected structure type.

Aspects include each additional exposure including: obtaining a correction reticle having transmission or reflection in the areas corresponding to the selected structure types; and exposing the wafers with the correction reticle in addition to the exposure with the first reticle. Further aspects include exposing the wafer with the first reticle and up to all but one additional (correction) reticle on a first tool, and exposing the wafer with all of the remaining additional (correction) reticles on one or more different tools, less advanced than the first tool. Other aspects include obtaining one or more correction reticles including programming one or more programmable reticles. Further aspects include: varying structure sizes between fields and/or wafers by varying one, several, or all of the doses between different exposure fields and/or different wafers, respectively, wherein doses include both the dose of the exposure with the first reticle and doses of the additional exposures, prior to further processing the wafers, and determining one or several properties of the chips processed with the different doses, thereby determining the dependence of these properties on the corresponding structure sizes. Other aspects include applying at least one additional exposure using a wavelength different from a wavelength used for the exposure of the one or more wafers with the first reticle or using charged particles.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

Figure 1A:
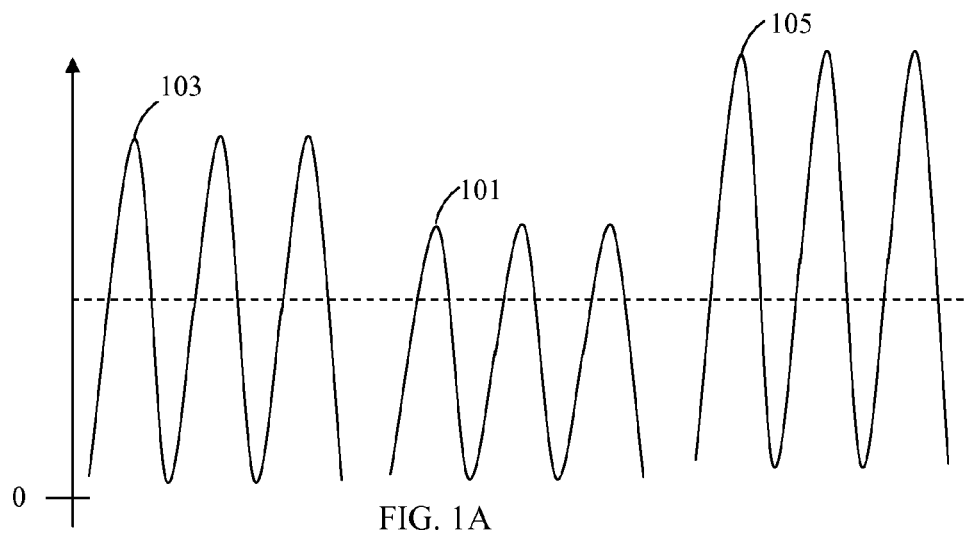
FIG. 1A schematically illustrates the aerial image intensity on the wafer obtained by exposure with a reticle without correction, and FIG. 1B schematically illustrates the pattern produced by the exposure with the reticle on a wafer, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of CD variations attendant upon lithographic patterning of a wafer, of displaced test structures attendant upon developing and/or etching a lithographic pattern, and of selective variation of structure sizes within a lithographic pattern. In accordance with embodiments of the present disclosure, a selected second exposure using a second reticle and a lower intensity fixes the CD variations without the need for a new copy of the first reticle. Similarly, a selected second exposure using a second reticle with a relatively high intensity eliminates unwanted small test structures before the developing and/or etching step. Alternatively, a selected second exposure using a second reticle and a lower intensity selectively varies the sizes of selected structures within the lithographic pattern. The second reticle may be a low-grade and inexpensive reticle, which may be formed and delivered quickly, thereby reducing process setup times. Further the intensity for the second exposure may be modified to optimize the effect, thereby allowing for further corrections without a wait for another reticle.

Methodology in accordance with embodiments of the present disclosure includes obtaining a first reticle having a pattern corresponding to a target pattern for a wafer; exposing a first wafer with the first reticle using a first dosage, or determining corresponding portions of the wafer pattern by way of measurement and/or inspection of the first reticle and calculation or simulation of the resulting wafer pattern; identifying variations in critical dimension (CD) between the exposed wafer or the calculated/simulated wafer pattern and the target pattern; exposing a second wafer covered with a second photoresist with the first reticle using a second dosage; and correcting the CD variations by applying an additional exposure of the second wafer, to the second photoresist that is also exposed with the first reticle, before or after exposing the second photoresist with the first reticle.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1B:
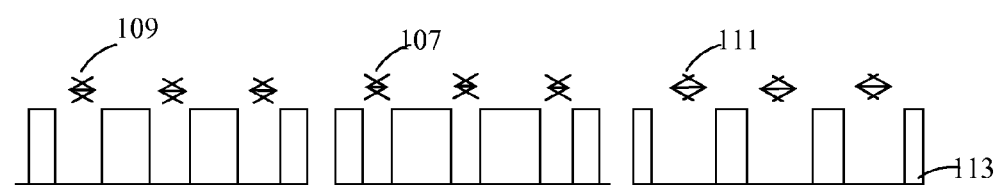
FIG. 1C schematically illustrates the aerial image intensities obtained by exposure with the reticle used in FIG. 1A, by a second exposure (e.g. with a correction reticle), and by the combination of the exposure with the original reticle and the second exposure, and FIG. 1D schematically illustrates the pattern produced through the combination of the two exposures, in accordance with an exemplary embodiment.

FIG. 1A schematically illustrates the aerial image intensity on a wafer obtained with a given reticle, which may be transmissive or reflective (e.g., an EUV reticle), with no correction. Three portions of the aerial image are shown next to each other. The corresponding areas on the wafer need not actually be neighboring areas but can be anywhere within the exposure field. In this example it is assumed that the target patterns of the three portions are identical. Therefore, the three portions of the aerial image should in the ideal case also be identical. However, it can be seen that they actually differ in intensity due to some perturbation effect, e.g. variations in the pattern sizes on the reticle. FIG. 1B schematically illustrates the corresponding pattern formed on a wafer, in which the wafer is exposed with the reticle with a first dosage optimized to achieve the best overall matching between the printed wafer CD and the target CD of the critical features in the design. As shown, portions 101, 103, and 105 in FIG. 1A have increasing amplitudes. Adverting to FIG. 1B, the spaces 107, 109, and 111 created on wafer 113 have increasing widths, with the largest space (111) corresponding to portion 105 in FIG. 1A where the aerial image intensity has the largest amplitude. This is in contrast to the widths of the corresponding target patterns which are assumed to be identical for spaces 107, 109, and 111.

Figure 1C:
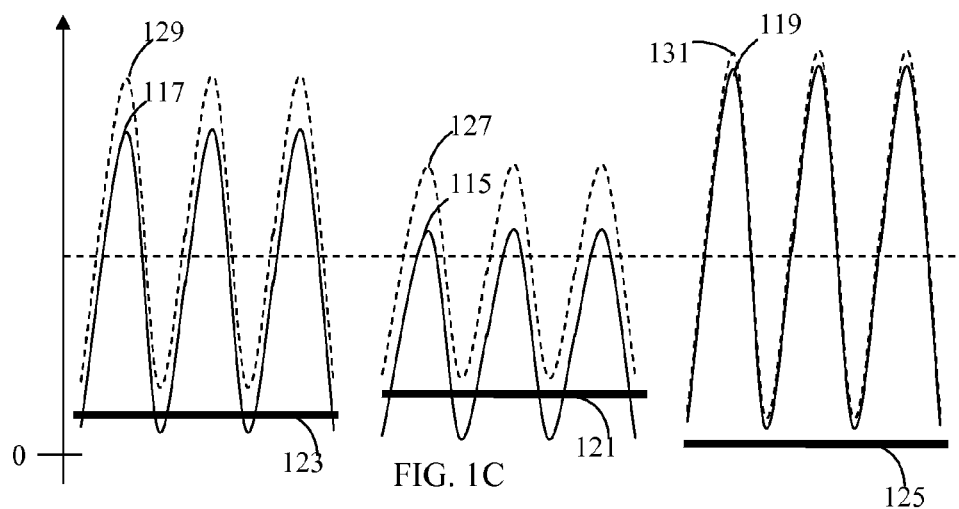
Figure 1D:
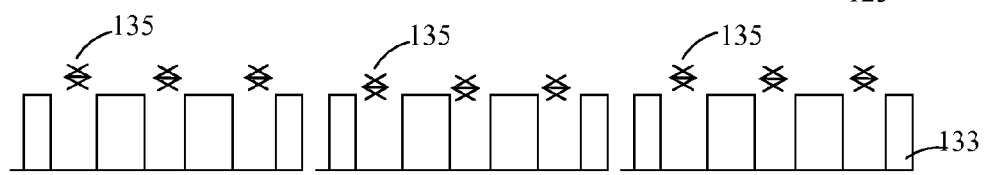

FIG. 1C schematically illustrates the aerial image intensity with correction. Portions 115, 117, and 119 represent the aerial image intensity during an exposure with the original reticle, but with a reduced dosage. As shown, portions 115, 117, and 119 correspond to 101, 103, and 105, respectively, of FIG. 1A, but have reduced amplitudes due to the reduced dosage. A second exposure, which may be achieved by using a correction reticle, which may be transmissive or reflective, is represented by elements 121, 123, and 125. As illustrated, the second exposure applies a gradual light intensity, and generally a low intensity compared to the exposure with the original reticle, for example a few percent of the original intensity, e.g., 1% to 20% of the original intensity, with long range spatial variation (long range as compared to the spatial variation of the exposure with the original reticle, which is defined by the feature sizes on the original reticle). The combined aerial image intensity 127, 129, and 131 produces a pattern on wafer 133, as illustrated in FIG. 1D with uniform critical dimensions 135 that all are on target. Note that the depiction of combined aerial image intensities 127, 129, and 131 does not mean that the exposures that created aerial images 115, 117, and 119 and 121, 123, and 125, respectively, occurred at the same time, but rather that their effects on the photoresist (the so-called creation of the latent image) are cumulative, essentially as if the exposures actually occurred simultaneously. As discussed in more detail below, the correction exposure may be applied using a different type of radiation than that of the exposure with the original reticle, e.g. a different wavelength. In this case, the depicted aerial image intensities in FIG. 1C are to be understood as being in relation to the sensitivity of the resist to the respective radiation types, and a lower intensity for the correction exposure has to be understood as lower in relation to the respective resist sensitivities. For example, if the sensitivity of the resist to the radiation type of the correction exposure is less than its sensitivity to the radiation of the original exposure, the energy of the correction exposure may actually be higher, but its effect on the resist will be smaller in magnitude compared to the original exposure.

Returning to FIGS. 1A and 1B, since the largest CD variation occurs at 111, the reduction in dosage for the first exposure may be calculated to obtain spaces that are substantially on target at the position of 111. The reduction in dosage is applied to the entire wafer, which renders previously on-target spaces too small, and previously too small spaces even smaller. The needed correction may then be determined, and (assuming the second exposure is achieved by using a correction reticle) a correction reticle may be written with corresponding transmission or reflection variations, or regular patterns with varying clear field percentage. The wafer may be exposed with the original reticle and then with the correction reticle, or the wafer may be exposed with the correction reticle first. In addition to exposure dose (or light intensity), other parameters of the exposure with the correction reticle may be modified, such as focus and numerical aperture (NA), to artificially reduce the spatial resolution to a desired level (namely to the level where the regular patterns are no longer resolved), to produce a greyscale (gradual light intensity) proportional to the local clear field percentage of the regular patterns on the correction reticle.

Figure 2:
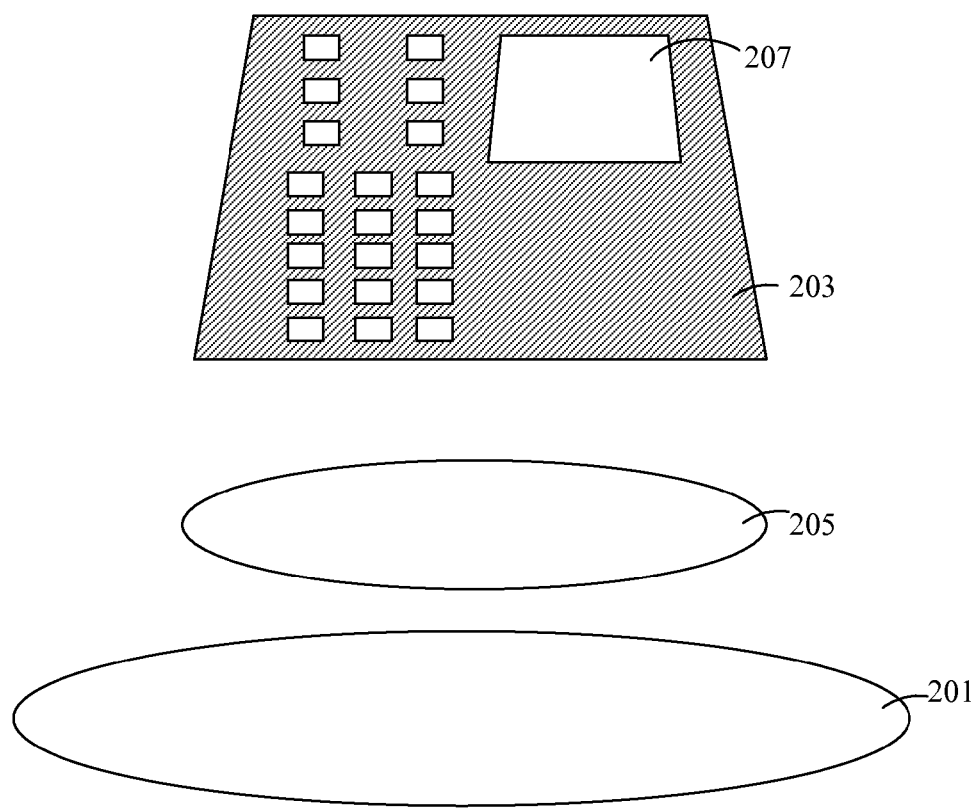
FIG. 2 schematically illustrates exposure with a correction reticle, in accordance with an exemplary embodiment.

Adverting to FIG. 2, exposure with a correction reticle, in accordance with an exemplary embodiment, is illustrated. In this case, a correction exposure through a transmissive reticle is depicted. In other cases, the correction exposure may be done with a reflective correction reticle (e.g. an EUV reticle). The primary and the correction reticle may be of the same type, namely if the primary and the correction exposure are performed with the same lithographic wavelength; however, primary and correction reticle may also be of different types, as the exposure wavelengths need not be identical either, as long as the photoresist is sensitive to both wavelengths. As shown, a resist covered wafer 201 is exposed with a correction reticle 203 and scanner projection optics 205. Correction reticle 203 is formed with a regular pattern of varying density, i.e. varying average transmission. In the left hand side of the depicted reticle, the varying density is achieved by varying the distance between the openings; alternatively, the same effect may be achieved by keeping the distances fixed and varying the sizes of the openings, or by varying both distance and size. Reticle 203 also includes opening 207, a large opening to create illumination on the wafer, as well as a portion that is completely dark, which are the two opposite extremes of pattern density. With a reflective correction reticle, opening 207 would correspond to a reflective portion, and the regular patterns of openings shown on the left hand side would correspond to similar patterns of reflective regions. The exposure dose for the correction reticle may be a few percent, e.g., 1% to 20% of the dose for the original reticle. The second exposure may occur before or after exposure with the original reticle. In addition, the exposure conditions may be modified to create a locally uniform greyscale and achieve a smooth intensity distribution at the wafer level, where the regular patterns shown on the left hand side of the correction reticle are no longer individually resolved.

Since the correction reticle may be a standard low grade reticle rather than a sophisticated one such as the original reticle, it may be less expensive than a new reticle, especially for EUV original reticles, and can be obtained quickly. Alternatively, a programmable reticle, for example a liquid crystal display (LCD), may be used for the correction reticle. A programmable reticle may be more expensive than a low grade reticle in the short term, but is reusable and may, therefore, reduce costs in the long term. In addition, a programmable reticle strongly reduces the setup time for the second exposure, because no second reticle needs to be ordered and manufactured. Further, instead of using a correction reticle, correction of square fields (for example, for multipurpose wafers) may be accomplished by blading within a scanner tool without employing a correction reticle or with a completely transparent or reflective "dummy" correction reticle, or specially designed tools may be employed which apply a second exposure with suitable long-range spatial variations without employing a reticle.

With a low grade correction reticle, a standard tool may be used for both the original and the second exposures, reducing costs by eliminating the need for a new high grade reticle. Even if the same tool and the same reticle type are used for the original and second (correction) exposure, the correction reticle can be of a lower grade and, therefore, cheaper and faster to manufacture, since the requirements for it regarding pattern fidelity, defectivity, and in many cases also spatial resolution, will be more relaxed, due to the fact that its purpose is only the creation of a greyscale map. Alternatively, a less advanced exposure tool, for example dry instead of immersion or other light sources, for example supplying KrF, ArF, i-line, or other optical wavelengths, may be used for the second exposure, which further reduces cost. Although alternative correction wavelengths may be used in combination with either a transmissive or reflective primary reticle, due to the high cost of EUV lithography, it will be advantageous to correct a primary EUV exposure by use of alternative wavelengths. As an alternative to using a correction reticle, a dedicated tool or chamber capable of creating a programmable illumination with the suitable spatial resolution (e.g. using scanning laser beams, LCD arrays, or micromirrors) may be employed for the second exposure. The advantages and disadvantages of this approach are similar to the approach using a programmable reticle. Besides electromagnetic radiation (EUV or optical wavelengths), charged particles (electrons or ions) may be employed to create the correction exposure, in particular in the case that an EUV resist is not sensitive to optical wavelengths, but to charged particles (e.g. electrons). Reverting to the scenario including a correction reticle, wafers may still be printed with the original reticle while the correction reticle is being prepared, and then transferred, for example, to another chamber or tool for the second exposure once the correction reticle is written, thereby saving process time. Further, while the correction reticle is being prepared, wafers may still be printed with the original reticle for purposes like setting up processes or setting up measurement recipes, for which high CD fidelity is not required.

Figure 3A:
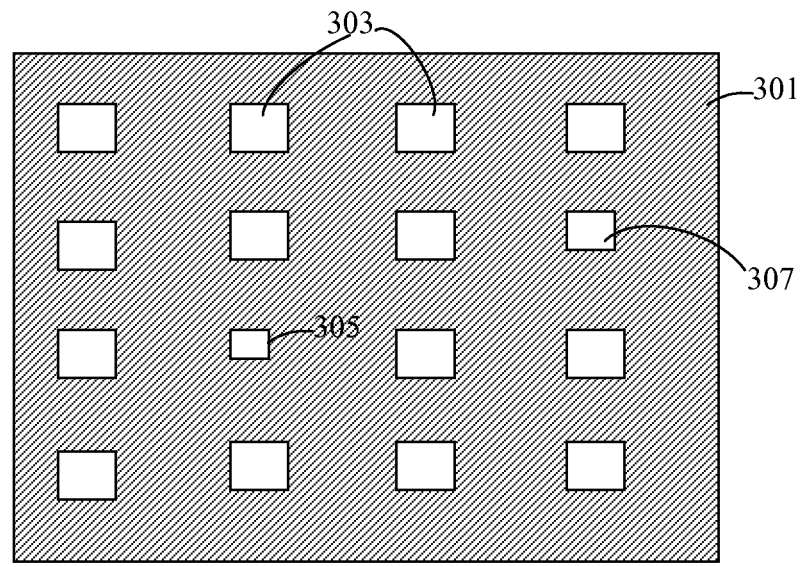
FIG. 3A schematically illustrates a portion of a reticle including undersized contact shapes, FIG. 3B schematically illustrates a wafer image corresponding to the reticle portion of FIG. 3A, FIG. 3C schematically illustrates a portion of a correction reticle for the image shown in FIG. 3B, and FIG. 3D schematically illustrates a corrected wafer image, in accordance with an exemplary embodiment.
Figure 3B:
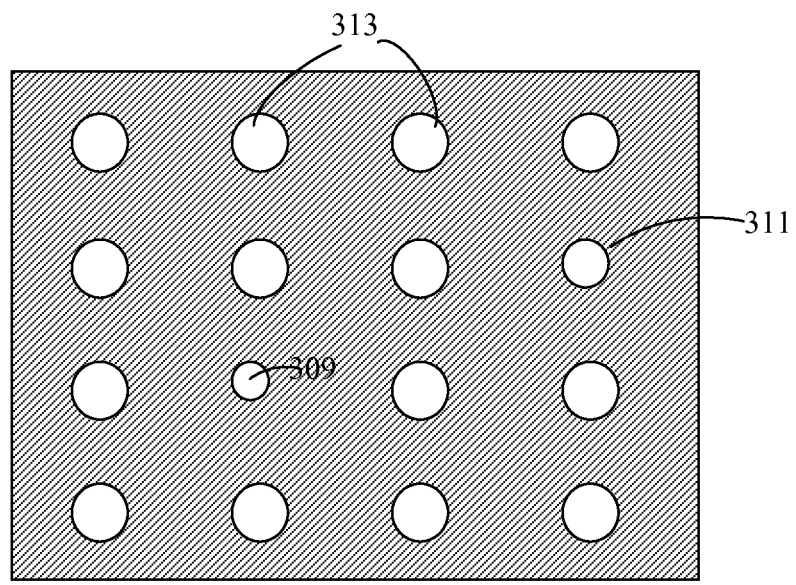

In accordance with another embodiment, undersized contacts or other individual features may be corrected using a second reticle with a reduced exposure. For example, FIG. 3A schematically illustrates a portion of a reticle 301 including a number of contact shapes 303, 305, and 307. The contact shapes may have edge lengths and spacings of 300 nanometers (nm). As shown, shapes 305 and 307 are undersized and need correction. FIG. 3B schematically illustrates the corresponding wafer image without correction. Undersized contacts 309 and 311 correspond to undersized portions 305 and 307 in FIG. 3A.

Figure 3C:
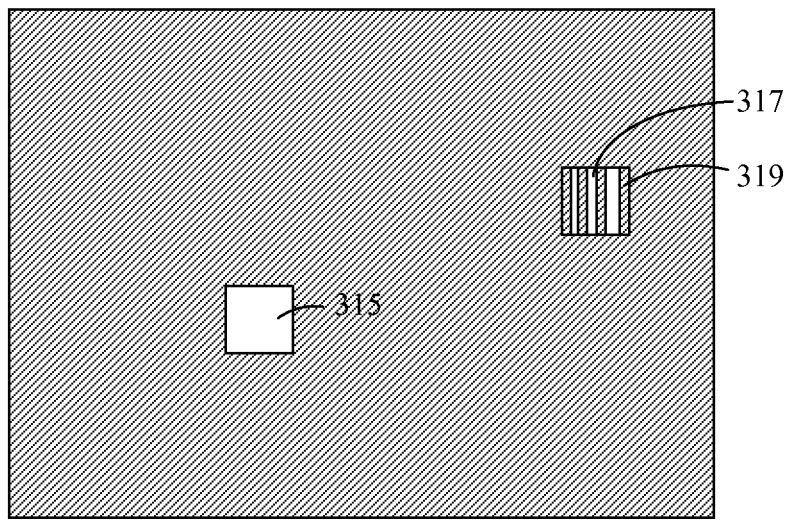
Figure 3D:
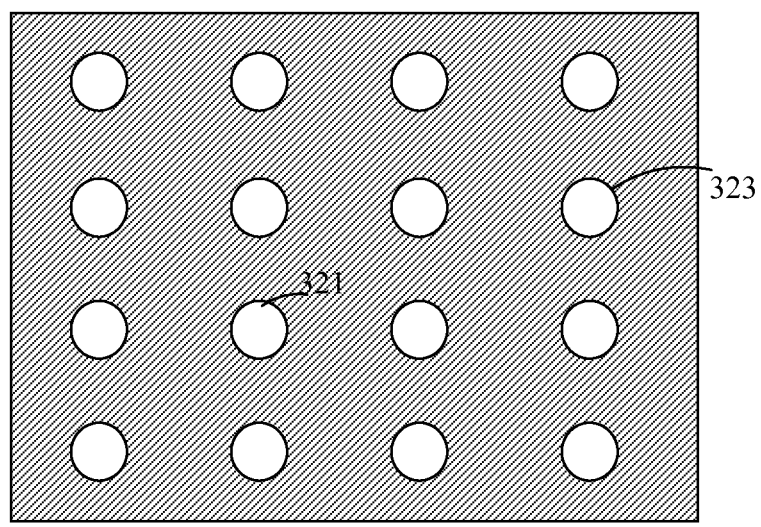

As illustrated in FIG. 3C, a correction reticle may be formed with opening or reflective portion 315 and patterned area 317 (containing sub-resolution structures) corresponding to undersized contacts 309 and 311 in FIG. 3B. Opening or reflective portion 315 and patterned area 317 are larger than the original contact shapes, making the correction reticle less overlay sensitive and ensuring that the positions of the contact holes formed on the wafer are mainly defined by the exposure with the original reticle. The correction reticle is easily aligned with the wafer such that the corresponding patterns are matched between the original and the correction reticle. The correction may be binary, as exemplified by opening or reflective portion 315, or the correction reticle may include sub-resolution structures 319 in patterned area 317 to modulate transmission or reflection. Sub-resolution structures are for example dark lines printed on the reticle with a pitch below the resolution limit of the scanner optics, which are not resolved on the wafer and create a greyscale image. Subsequent to a low exposure dose with the correction reticle, a corrected wafer image, with corrected contacts 321 and 323 being the same size as the rest of the contacts, is formed, as illustrated in FIG. 3D.

Figure 4A:
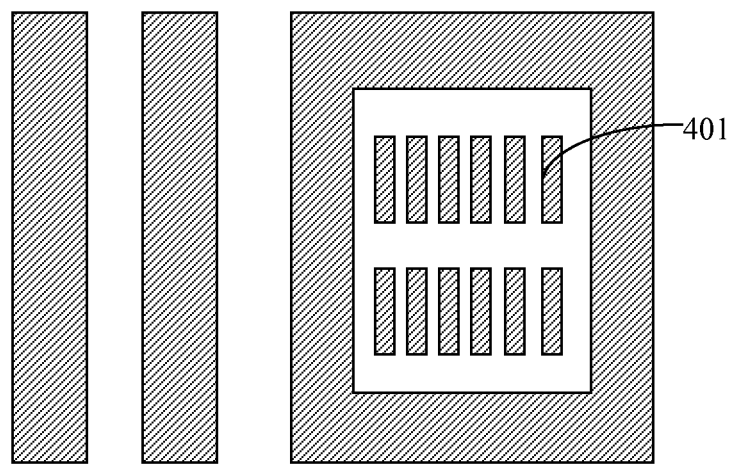
FIG. 4A schematically illustrates a portion of a reticle including small test structures, FIG. 4B schematically illustrates a corresponding portion of a wafer image after exposure with the reticle of FIG. 4A without correction, FIG. 4C schematically illustrates a portion of a correction reticle for the image shown in FIG. 4B, and FIG. 4D schematically illustrates a corrected wafer image, in accordance with an exemplary embodiment.
Figure 4B:
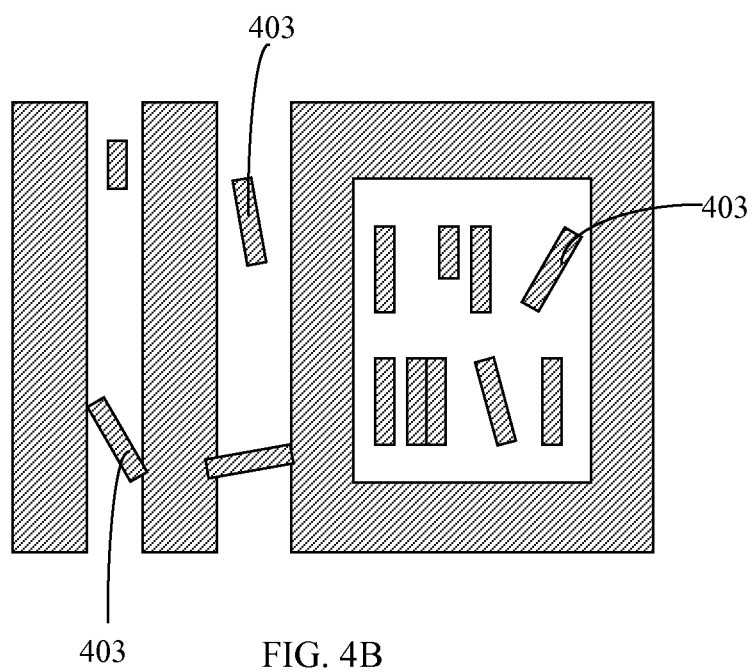

Adverting to FIGS. 4A through 4D, correction reticles may be employed for eliminating small test structures on the wafer which create a defect hazard. Such test structures may be used, for example, for determining the resolution limit of a process, but can cause defect problems. Sometimes such structures are left accidentally in the design. FIG. 4A schematically illustrates a portion of a reticle including small test structures 401. As shown in FIG. 4B, parts of the test structures may appear on the wafer image in undesirable locations, where they act as defects. Specifically, a resist may be formed over the wafer to a thickness of 100 nm, and the small test structures may be 20 nm wide. After the resist covered wafer is exposed, the resist is developed and the wafer is etched. The small test structures will be printed on the wafer. During developing or etching the small test structures, which are significantly higher than they are wide, topple over or are lifted and move around, as exemplified by structures 403 in FIG. 4B.

Figure 4C:
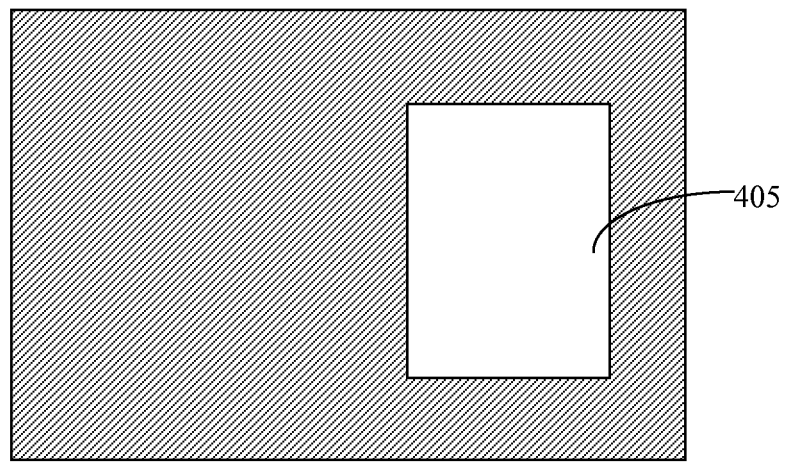
Figure 4D:
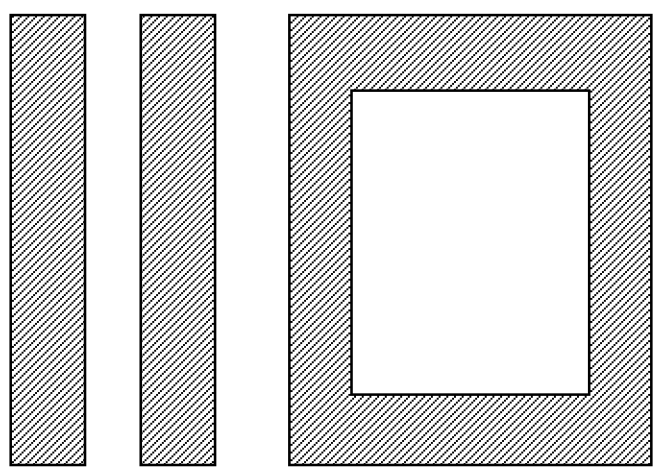

To eliminate test structures 403, a correction reticle, as illustrated in FIG. 4C, is formed with a large opening or reflective portion 405 at the position corresponding to the position of structures 401. The wafer may be exposed with the correction reticle at 60% of the original exposure. The resulting wafer image is illustrated in FIG. 4D. As the wafer is exposed with the correction reticle in addition to the exposure with the original reticle and prior to developing the resist and etching the wafer, the test structures and the defects caused by them are no longer present.

Figure 5A:
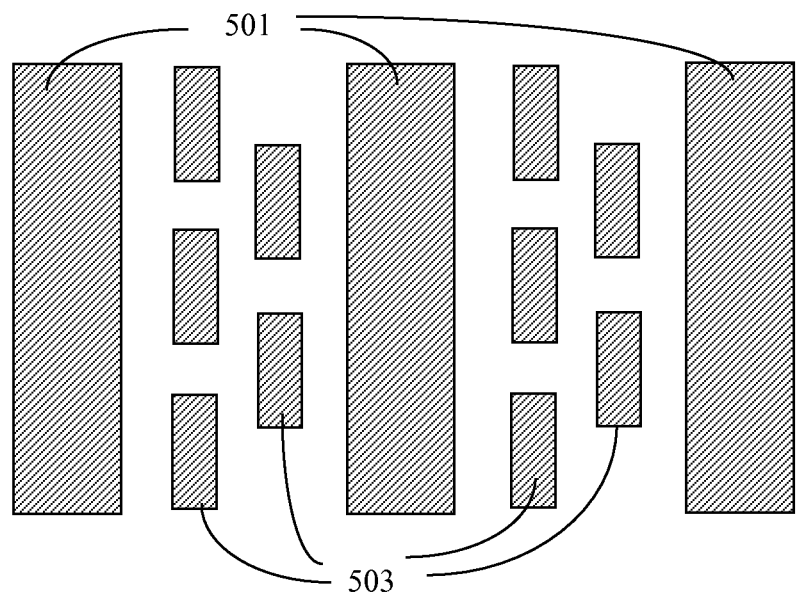
FIG. 5A schematically illustrates a portion of a reticle including different types of structures, FIG. 5B schematically illustrates a corresponding portion of a wafer image after exposure with the reticle of FIG. 5A alone, FIG. 5C schematically illustrates a portion of an additional reticle, and FIG. 5D schematically illustrates a wafer image obtained after exposure with both the reticles shown in FIG. 5A and FIG. 5C, in accordance with an exemplary embodiment.
Figure 5B:
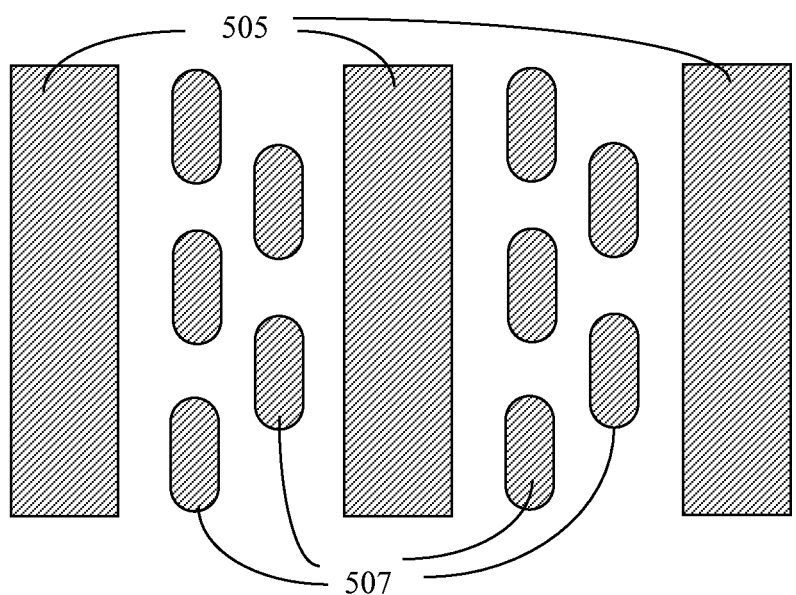

Adverting to FIG. 5A, a primary reticle may include different types of patterns 501 and 503. FIG. 5B illustrates a wafer print obtained with the primary reticle and a first, or original, dose, where structures 505 and 507 correspond to structures 501 and 503 on the primary reticle, respectively. In product development, it may be useful to be able to vary the sizes of structures 505 and 507 independently of each other to find optimum pattern dimensions, for example in terms of performance or yield.

Figure 5C:
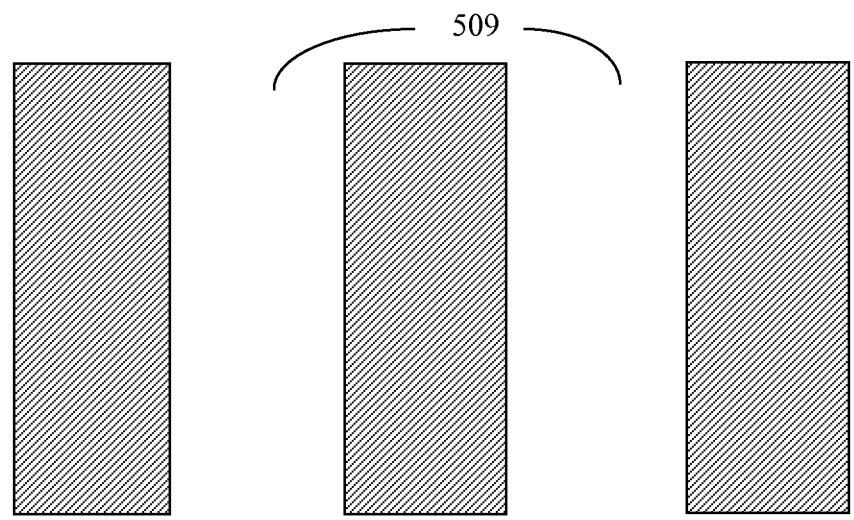
Figure 5D:
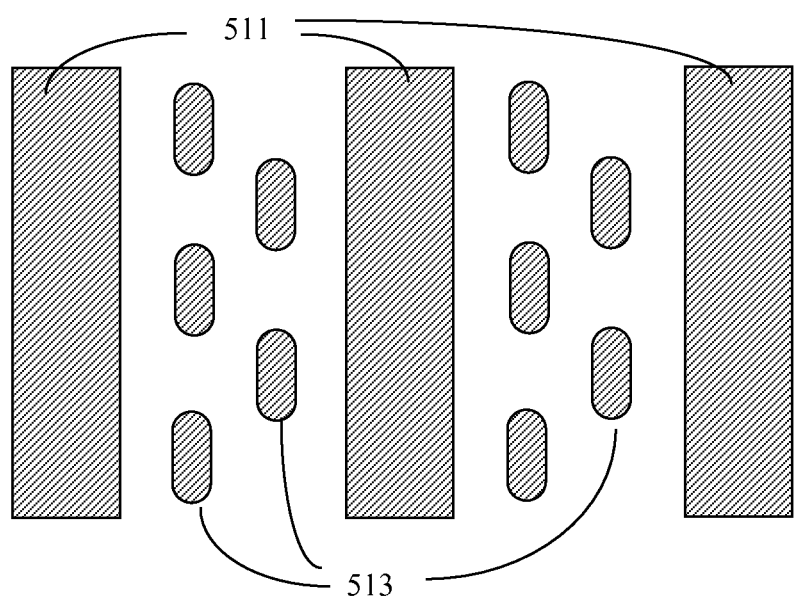

FIG. 5C illustrates a portion of a second, or additional, reticle, with openings or reflective portions 509 corresponding to the areas containing structures 503 in the primary reticle. FIG. 5D illustrates a wafer print obtained by exposing the wafer with both the primary reticle at the original dose, and the additional reticle at a dose significantly lower than the original dose, for example 1 to 20% of the original dose. Structures 511, corresponding to structures 501 in the primary reticle, have substantially the same size as structures 505 in FIG. 5B, whereas structures 513 corresponding to structures 503 in the primary reticle, are smaller than structures 507 in FIG. 5B. Various doses may be tried for the exposure with the additional reticle to find the optimum size for structures 513. In a more elaborate test, the dose for the exposure with the primary reticle may be varied, thereby varying the sizes of all structures on the wafer, and the dose for the exposure with the additional reticle may be varied in addition, thereby further selectively varying the sizes of the structures corresponding to structures 503. In this example, a part of a wafer image containing two pattern types, and one correction exposure to selectively modify the sizes of one of the pattern types, are depicted. However, the method is easily extended to a greater number of pattern types, and more correction exposures for the independent variation of the sizes of several selected pattern types. Further, the term "pattern type" may be understood in a more general sense than as a collection of identical polygons; e.g., memory circuitry may be understood as a different pattern type than logic circuitry.

The embodiments of FIGS. 3 through 5 have been disclosed as separate applications for a correction exposure. However the same correction exposure may be employed for two or more of the three embodiments. In other words, the same correction exposure may be used for two or more of the following: a) correction of across-field CD variations, b) selective variation of the CD of certain pattern types, and c) elimination of unwanted test structures on the wafer. Compared to established methods to correct CD variation on the wafer, to the extent they exist for the given type of lithography, namely dose modulation and modification of the primary reticle, the embodiments of the present disclosure offer numerous advantages. However, the embodiments of the present disclosure can also easily be applied in combination with all known pre-existing methods to correct CD variation on the wafer.

The embodiments of the present disclosure can achieve several technical effects, such as correction of CD variations at relatively low cost, e.g. by using a low grade second reticle and either the standard tool or a lower grade tool for the second exposure, and without adding significant time to the setup time. In addition, unwanted small test structures may be removed at relatively low cost and without adding significant time to the setup time. In addition, CDs of certain structures may be varied selectively for development purposes. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices, particularly for 28 nm, 20 nm, and smaller technology nodes, double patterning, and multipurpose wafers.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   obtaining a first reflective reticle having a pattern of structures corresponding to a target pattern for a wafer;
   exposing a first wafer covered with a first photoresist with the first reticle using a first dosage, or measuring and/or inspecting portions of the pattern of the first reticle and calculating and/or simulating corresponding portions of a first wafer pattern obtained with a predetermined first dosage;
   identifying variations in critical dimension (CD) between the exposed first wafer or the calculated or simulated first wafer pattern and the target pattern for different features in the target pattern;
   exposing a second wafer covered with a second photoresist with the first reticle using a second dosage; and
   correcting the CD variations by applying an additional exposure of the second wafer, to the second photoresist that is also exposed with the first reticle, before or after exposing the second photoresist with the first reticle.

2. The method according to claim 1, wherein applying the additional exposure comprises obtaining a correction reticle having transmission or reflection variations corresponding to the identified CD variations and exposing the second wafer with the correction reticle using a third dosage.

3. The method according to claim 2, wherein the correction reticle has spatial variations in average transmission or reflection that occur in a range that is longer compared to sizes of the pattern on the first reticle.

4. The method according to claim 2, comprising artificially decreasing the spatial resolution of the additional exposure with the correction reticle to achieve smooth intensity variations, by adjusting the numerical aperture of the optical system and/or the focus of the additional exposure and/or the illumination conditions of the correction reticle.

5. The method according to claim 2, comprising exposing the second wafer with the first reticle on a first tool, and exposing the second wafer with the correction reticle on a second tool, less advanced than the first tool.

6. The method according to claim 2, wherein obtaining a correction reticle comprises programming a programmable reticle.

7. The method according to claim 2, wherein:
   the features having CD variations comprise individual contact holes or other individual features;
   the CD variations of the individual features correspond to a lack of illumination intensity in the formation of these features; and
   the additional exposure comprises:
      obtaining a correction reticle having openings or reflective portions, or areas with sub-resolution structures which modulate transmission or reflection, corresponding to the features having identified CD variations;
      aligning the openings or reflective portions, or areas with sub-resolution structures, of the correction reticle with the features having identified CD variations on the wafer; and
      exposing the second wafer with the correction reticle using a third dosage.

8. The method according to claim 7, wherein the size of the openings or reflective portions, or of the areas with sub-resolution structures, of the correction reticle is larger than the size of the structures in the first reticle that correspond to the features having identified CD variations.

9. The method according to claim 1, comprising determining the second dosage by:
   identifying portions of the exposed first wafer or the calculated and/or simulated first wafer pattern where the sizes of the illuminated parts of the pattern are larger than the corresponding sizes of the target pattern; and
   calculating a dosage required to expose portions of the second wafer, corresponding to the identified portions, to substantially obtain the CD of the corresponding portions of the target pattern.

10. The method according to claim 1, comprising applying the additional exposure to the second wafer using a wavelength different from a wavelength used for the exposure of the second wafer with the first reticle or using charged particles.

11. A method comprising:
    obtaining a first reflective reticle having a pattern corresponding to a target pattern for a wafer and having additional structures;
    exposing a wafer covered with photoresist with the first reticle using a first dosage; and
    applying a second exposure to the photoresist covered wafer, before or after exposing the wafer with the first reticle, illuminating only areas of the wafer corresponding to the areas with additional structures in the first reticle, with a second dosage sufficient to either prevent the formation of the additional structures on the wafer or to modify their size and shape to increase the stability of the formed additional structures.

12. The method according to claim 11, wherein applying the second exposure comprises:
    obtaining a correction reticle having one or more openings or reflective portions at positions corresponding to positions of the additional structures on the first reticle;
    aligning the correction reticle with the wafer; and
    exposing the wafer with the correction reticle with the second dosage.

13. The method according to claim 12, comprising exposing the wafer with the first reticle on a first tool, and exposing the wafer with the correction reticle on a second tool, less advanced than the first tool.

14. The method according to claim 12, wherein obtaining a correction reticle comprises programming a programmable reticle.

15. The method according to claim 11 comprising sequentially:
    forming a resist on the wafer;

exposing the resist-covered wafer with the first reticle, and applying the second exposure to the resist-covered wafer;

and developing the resist.

16. The method according to claim 11, comprising applying the second exposure using a wavelength different from a wavelength used for the exposure of the wafer with the first reticle or using charged particles.

17. A method comprising:

obtaining a first reflective reticle having a pattern corresponding to a target pattern for a wafer, the target pattern containing structures of multiple structure types, each structure type corresponding to a different area;

exposing one or more wafers covered with photoresist with the first reticle using a first dosage; and selectively varying the sizes of structures of selected structure types in the different areas on the wafer by applying one or more additional exposures in the areas corresponding to the selected structure types, to the same photoresist that is exposed with the first reticle, the illumination intensity of the additional exposures being substantially uniform within each area containing a selected structure type.

18. The method according to claim 17, wherein each additional exposure comprises:

obtaining a correction reticle having transmission or reflection in the areas corresponding to the selected structure types; and exposing the wafers with the correction reticle in addition to the exposure with the first reticle.

19. The method according to claim 18, comprising exposing the wafer with the first reticle and up to all but one additional reticle on a first tool, and exposing the wafer with all of the remaining additional reticles on one or more different tools, less advanced than the first tool.

20. The method according to claim 18, wherein obtaining one or more correction reticles comprises programming one or more programmable reticles.

21. The method according to claim 17, comprising varying structure sizes between fields and/or wafers by varying one, several, or all of the doses between different exposure fields and/or different wafers, respectively, wherein doses include both the dose of the exposure with the first reticle and doses of the additional exposures.

22. The method according to claim 17, comprising applying at least one additional exposure using a wavelength different from a wavelength used for the exposure of the one or more wafers with the first reticle or using charged particles.

* * * * *